(12) United States Patent
Lee (10) Patent No.: US 7,307,556 B2
(45) Date of Patent: Dec. 11, 2007

(54) ERROR CORRECTION FOR RLL CHANNEL BITS IN DEMODULATION RULES

(75) Inventor: Jui-Cheng Lee, Hsin-Chu (TW)

(73) Assignee: Lite-On It Corporation, Taipei (TW)

(*) Notice: Subject to any disclaimer, the term of this patent is extended or adjusted under 35 U.S.C. 154(b) by 116 days.

(21) Appl. No.: 11/280,417

(22) Filed: Nov. 17, 2005

(65) Prior Publication Data

US 2006/0109152 A1 May 25, 2006

(30) Foreign Application Priority Data

Nov. 19, 2004 (TW) ............................. 93135584 A (51) Int. Cl.
*H03M 7/00* (2006.01)

(52) U.S. Cl. .......................... 341/59; 341/50
(58) Field of Classification Search ............. 341/50–70
See application file for complete search history.

(56) References Cited

U.S. PATENT DOCUMENTS

| | | | | |
|---|---|---|---|---|
| 5,717,395 A | * | 2/1998 | Zook | 341/59 |
| 5,859,601 A | * | 1/1999 | Moon et al. | 341/59 |
| 6,032,284 A | * | 2/2000 | Bliss | 714/792 |

* cited by examiner

*Primary Examiner*—Lam T. Mai
(74) *Attorney, Agent, or Firm*—Birch, Stewart, Kolasch & Birch, LLP (57) ABSTRACT

RLL (Run Length Limited) code is a well-known channel coding technique, which has no error correction ability itself. The present invention discloses a decoding method, which corrects the channel bit errors via a modified demodulation table with added demodulation rules without increasing any modification circuit, to reduce channel bit errors of RLL code sequences and improve the decoding accuracy of error correction table.

10 Claims, 6 Drawing Sheets

| bit sequence | data sequence |
|:---:|:---:|
| 101001010 | 001011 |
| 001010101 | 101100 |
| ⋮ | ⋮ |
| 101000 | 0000 |
| 100000 | 0001 |
| ⋮ | ⋮ |
| 101 | 00 |
| ⋮ | ⋮ |
| 001100101 | 101100 |
| 101100101 | 001100 |
| 011001 | 1100 |
| 110 | 00 |
| ⋮ | ⋮ |

FIG.1(Prior Art)

| data bits | RLL(2, 7) codeword |
|---|---|
| 11 | 1000 |
| 10 | 0100 |
| 011 | 001000 |
| 010 | 100100 |
| 000 | 000100 |
| 0010 | 00100100 |
| 0011 | 00001000 |

| data bits | RLL(1, 7) codeword |
|---|---|
| 00 | 101 |
| 01 | 100 |
| 10 | 001 |
| 11 | 010 |
| 0000 | 101000 |
| 0001 | 100000 |
| 1000 | 001000 |
| 1001 | 010000 |

FIG. 5A

| bit sequence | data sequence |
|---|---|
| 101001010 | 001011 |
| 001010101 | 101100 |
| ⋮ | ⋮ |
| 101000 | 0000 |
| 100000 | 0001 |
| ⋮ | ⋮ |
| 101 | 00 |
| ⋮ | ⋮ |
| 001100101 | 101100 |
| 101100101 | 001100 |
| 011001 | 1100 |
| 110 | 00 |
| ⋮ | ⋮ |

54 (upper group), 56 (lower group)

FIG. 5B

ERROR CORRECTION FOR RLL CHANNEL BITS IN DEMODULATION RULES

BACKGROUND OF THE INVENTION

1. Field of the Invention

The invention relates to an error correction method for RLL codes. More particularly, the invention relates to correct channel bit error of RLL code with newly added demodulation rules.

2. Description of the Prior Art

Figure 1:
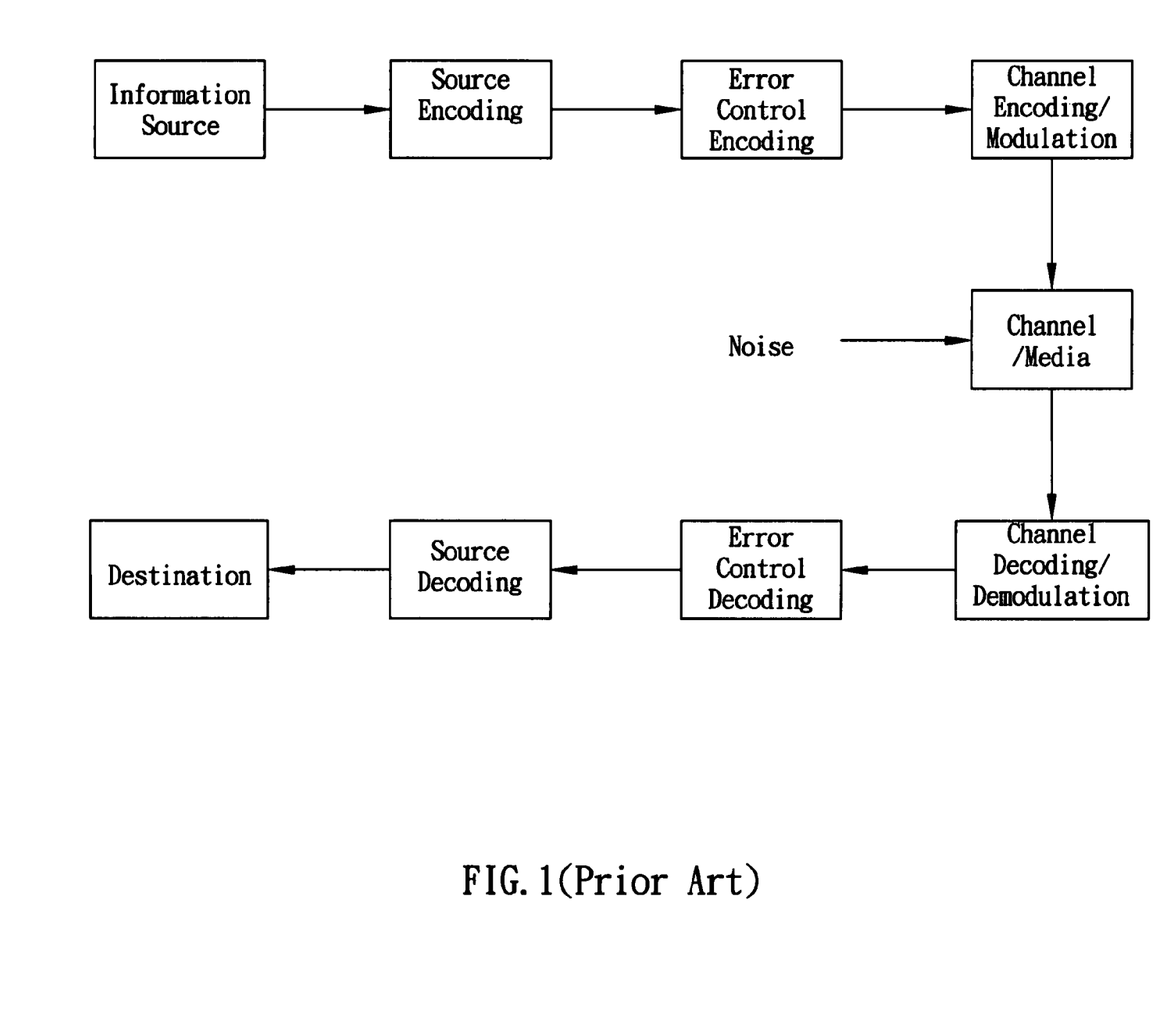
FIG. 1 illustrates the block diagram of a typical communication/storage system.

Coding plays an important rule in digital systems, especially the digital communication and the data storage system. Generally speaking, coding techniques may divide into three categories: source coding, error control coding, and channel coding. The main purpose of source coding is to transform the information—from human, computer, or whatever—into digital data sequences (especially binary data), furthermore, compress them for reducing information entropy. Error control coding encodes the digital data sequence into a new data sequence that may detect or correct errors, thereby providing error protection for the data sequence. The objective of channel coding is to make the data sequence being able to transmit more efficiently upon communication channel and storage media. FIG. 1 illustrates the block diagram of a typical communication/storage system. As well as the drawing, error control coding is usually performed before channel coding. Hence, even the demodulated signals at receiver end contains error channel bits, the receiver end could detect/correct errors or reconstruct original data sequence as long as the error bits don't exceed the correction capability of an error control code.

As shown in FIG. 1, error correction for most communication/storage systems is usually performed in the error control decoding block and most channel codes have no error detection/correction capability. As mentioned in the foregoing descriptions, channel code is usually utilized for modulation, which makes data sequences transmitting with a higher transmission performance upon the communication channel or storage media. Gray code, for instance, is a simple and well-known coding technique, and it may be utilized as channel code, too. The main characteristics of the gray code is, each codeword has only 1 bit difference with a preceding codeword (such as the 3-bits gray code, if current codeword is 010, the succeeding codeword is limited to 011, 110, or 000). Because the gray code may apply to a phase shift keying (PSK) modulation for limiting the phase shift between consecutive signals and preventing 180°-phase reversion, it's suitable to some communication environments. Nowadays, though some coding techniques try to combine channel coding and error control coding together, such as continuous phase modulation (CPM), the distinction between error control coding and channel coding becomes more and more unobvious, but it's still under the impression that channel code has no error correction capability.

Run Length Limited (RLL) code is a famous channel coding technique. Because RLL encoded codeword reduces the transitions between bit "0" and "1", possesses synchronization information itself, and decreases the DC components of data signals, it becomes the most famous channel coding technique for storage systems such as the CD/DVD disks and the computer hard disks. RLL code is usually represented as RLL(x,y), in which x, y are natural integers. Letter x represents the smallest running length and y represents the longest running length for a RLL codeword, in other words, the amount of "0" between two channel bits "1" for a RLL encoded codeword is at least "x" and at most "y".

Figure 2A:
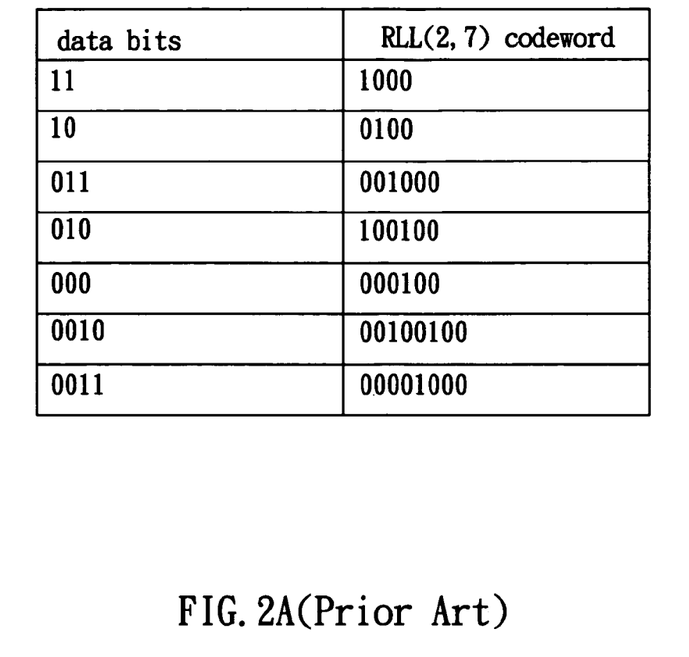
FIG. 2A depicts the encoding table for RLL(2,7) code.

For example, FIG. 2A depicts an encoding table of RLL (2,7) code. According to the table, a data sequence with values of 10001111 (divided as 10-0011-11) will be encoded as 0100-00001000-1000.

The relationships between the data sequence and its encoded codeword may combine as the demodulation rules, which is used to form the demodulation table of RLL code. When the receiving end receives a sequence of channel bits, the decoder decodes and reconstructs the original data sequence according to the demodulation rules of the demodulation table. For example, a data sequence D1=11011000 encodes into codeword C1=1000001000000100 in accordance with the encoding table of FIG. 2A. The demodulation table records the mapping between D1 and C1 as its demodulation rule, therefore when the receiving end receives the same codeword of C1, the demodulation table will decode it to data sequence D1.

Figure 2B:
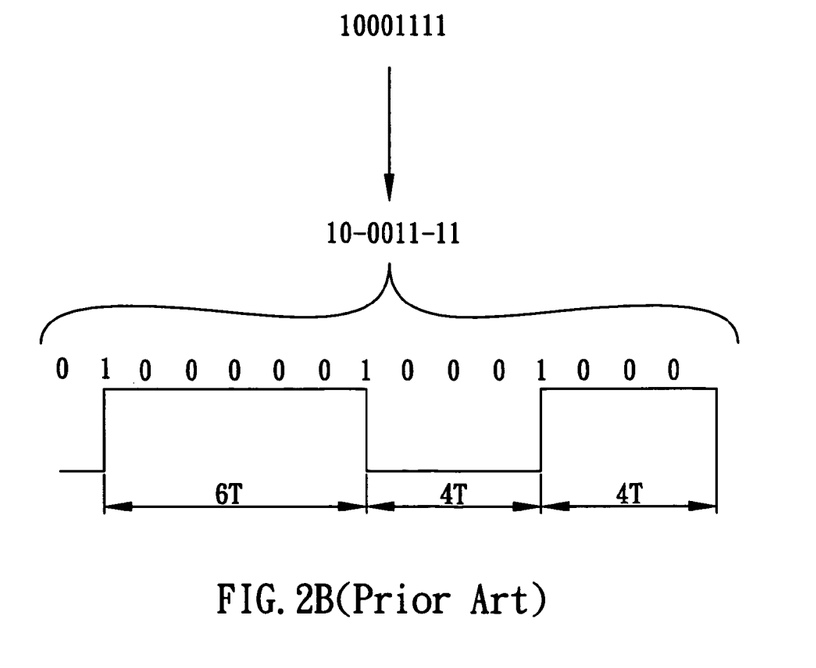
FIG. 2B depicts the mapping diagram of channel bit sequence upon the disk.

In hard disk, a flux transition represents a channel bit "1", the other is "0". In CD/DVD disks, the transition between "pit" and "land" represents channel bit "1", the others represent channel bit "0". FIG. 2B depicts the mapping diagram of channel bit sequence 0100000010001000 upon the disk. "4T" means there are 4−1=3 "0"s, "7T" means there are 7−1=6 "0"s between two channel bits "1". Channel bits upon a disk may be represented with the sequence of "nT", suchlike 7T4T4T represents channel bit sequence 1000000100010001. Normal signal components of RLL (2,7) encoded codeword are between 3T to 8T. Currently, the most popular RLL code consists of RLL(1,7), RLL(2,7), and RLL(2,10) code, in which the smallest signals are 2T, 3T and 3T, the largest signals are 8T, 8T and 11T respectively. When the length of pit or land are too short or the pickup head of a DVD player has sampled the channel bit sequence with the running length smaller than the codeword limitation (i.e., samples 1T signal as encoding in RLL (1,7) code), the demodulated/detected channel bit sequence is "illegal". If the RLL decoder decodes the "illegal" channel bit sequence directly by the original RLL decoding rules, it will result in incorrect data sequence.

Because RLL code has no error correction capability, it's essential to find another way for correcting RLL code before the error control coding operates. For concrete illustration, here takes RLL(1,7) code for example, in which 1T signal is the illegal signal component to the RLL(1,7) codeword. The regular methods for dealing with a 1T error comprise the first way, Ignore 1T error. It means, no matter if the 1T error exists or not, the RLL decoder still decodes it directly in accordance with the original decoding rules, thereby the decoded data sequence might be different with the original one. In general, the difference could be corrected by succeeding the error control decoding procedure, except the error amount exceeding the correction capability of the error control code.

Because the 1T signal is usually the improper detection result of an 2T signal (seldom 3T signal), the second way is to perform a 1T/2T signal conversion before the channel decoding procedure by increasing the 1T/2T correction circuit or modifying the firmware of the RLL decoder. Each time as receiving/reading a bit sequence, the 1T/2T correction detects if containing 1T signal. If yes, the 1T/2T correction circuit corrects the 1T signal into a 2T signal first and then the corrected bit sequence decoded by the original decoding table in after. The second way which performs 1T error correction before the RLL decoding reduces the error probability effectively, but the costs are that the decoder complexity and the decoding time (because the decoder "1T/2T correction circuit—" must determine if the received bit sequence contains illegal signal component all the time) is increased.

Figure 3A:
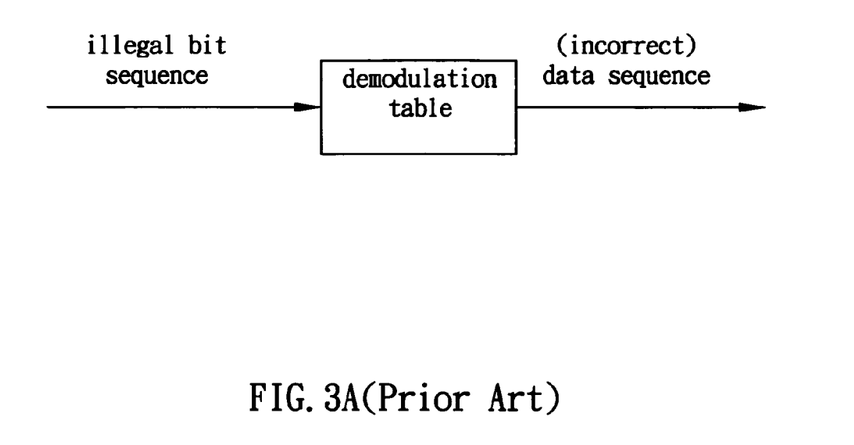
FIG. 3A depicts the RLL decoding scheme with ignoring 1T error.
Figure 3B:
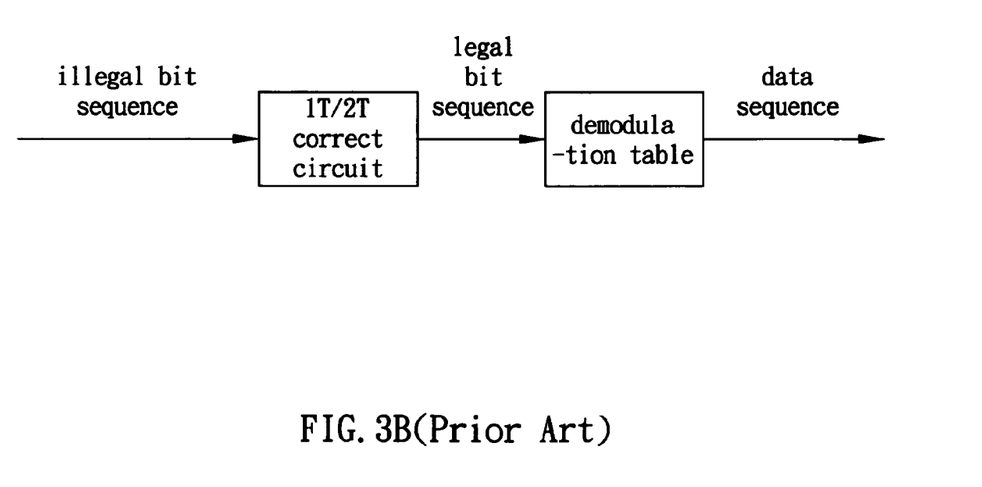
FIG. 3B depicts the RLL decoding scheme with 1T/2T correction circuits.

FIG. 3A and FIG. 3B depict the decoding architecture within ignoring 1T error and the decoding architecture with 1T/2T correction respectively, in which both demodulation tables remain the same and are not modified. If we could correct the illegal signal components of the RLL codeword to obtain error-less channel bit sequences without increasing any correction circuits, the error probability to the last obtained data/information after the error control decoding block (referring to FIG. 1) will be decreased effectively but without increasing the decoder complexity.

SUMMARY OF THE INVENTION

According to foregoing descriptions, an objective of the invention is to provide a method for correcting the illegal channel bit sequences of the RLL codeword before the error control code operates. By designing new demodulation rules which merges the mappings between the illegal channel bit sequence and its possible corresponding data sequence into the demodulation table, the present method makes it possible that the receiver end may correct the channel bit error (i.e., the 1T signal in RLL(1,7)) before performing an error control decoding. New demodulation table makes illegal channel bit sequences also associating with data sequences. Therefore, when receives the illegal channel bit sequence, the receiver end may directly decode the illegal channel bit sequence into the associating data sequence as well as decoding a legal channel bit sequence but without increasing any correction logic circuits (i.e., 1T/2T correction circuits).

Besides, the invention also provides a method and demodulation table for the RLL(1,7) code, which associates an illegal channel bit sequence having 1T signal components with a data sequence and merges the mapping into the demodulation table. Hence, the RLL decoder may decode the illegal channel bit sequence into its associating data sequence directly instead of the conventional way that performs the 1T/2T conversion before channel decoding.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Some preferred embodiments of the present invention will be described in detail in the following. However, beside the detailed description, the present invention can also be applied widely in other embodiments and the scope of the present invention is only limited by the appended claims.

The legal signal components for a RLL(x,y) encoded codeword are between (x+1)T and (y+1)T. For example, 2T–8T signals are legal, but 1T, 9T, 10T, . . . are illegal for RLL(1,7) code. If a data sequence encodes in RLL(x,y) code, its legal bit sequence should be between (x+1)T to (y+1)T, wherein x, y are natural integers and x is smaller than y. After transmitting to the receiver or reads out from the storage device, the received bit sequence may consist of illegal signal components (i.e., receives 1T signal components for RLL(1,7) encoded bit sequence). In other words, when the legal bit sequence is modulated to a channel, because the channel may induce noise, sometimes the received channel bit sequence for the received analog signals of receiver end is different with the original one and becomes an illegal bit sequence. As in the foregoing descriptions, the RLL code has no error correction capability, it's unrecognizable that if the received channel bit sequence is just different with its original values but sill belong to a legal bit sequence. However, "illegal" sequences are recognizable and correctable according to present invention.

According to the foregoing descriptions, illegal bit sequences may result from detection/demodulation error of a legal bit sequence. The original bit sequences for the same illegal bit sequence may be different, for example, the possible original bit sequence for RLL(1,7) encoded sequence 3T3T1T3T may be 3T2T2T3T or 3T3T2T2T. Conventional skills utilize a correction circuit to modify the illegal bit sequence to the legal bit sequence (i.e., modify 3T3T1T3T to 3T2TT3T) before RLL decoding. The present invention discloses an error-correctable decoding method, which modifies the demodulation rules of demodulation table by increasing the mappings between illegal bit sequences and possible data sequences, thereby making the decoder capable of correcting illegal bit sequences but unnecessarily that of the 1T/2T correction circuit.

Figure 4A:
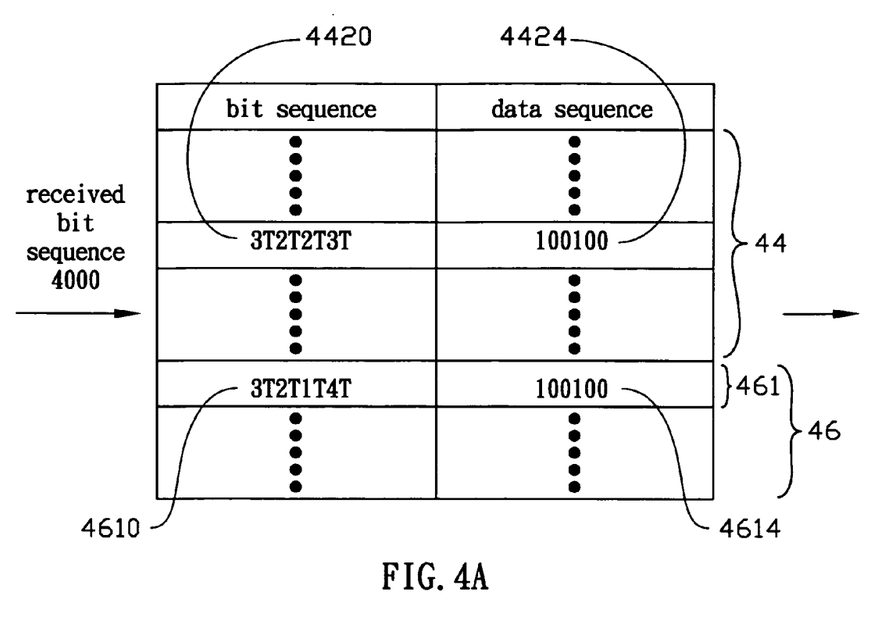
FIG. 4A depicts the diagram of modified demodulation table.

FIG. 4A illustrates the diagram for an embodiment of modified demodulation table. Block 42 contains the original demodulation rules; for example, bit sequence 4420 (3T2T2T3T) is associated with data sequence 4424 that values of 100100. Block 46 contains the newly added demodulation rules. For the newly added demodulation rule 461, bit sequence 4610 (3T4T1T4T) is illegal because it consists of an illegal signal component 1T. Assume that according to the statistic results, the most possible data sequence for illegal bit sequence 4610 is data sequence 4424. The present modified demodulation table increases a new demodulation rules 461, which makes the bit sequence 4610 also mapping to the same data sequence with the bit sequence 4420. In other words, the bit sequence 4610 and the bit sequence 4420 will be decoded into the same data sequence. Therefore, when the channel decoder receives a bit sequence 4000, if it equals to the bit sequence 4610, the channel decoder will decode it into the data sequence 4424, which has the same result to conventional skills that utilizes a 1T/2T correct circuit to correct 1T to 2T before channel decoding.

Figure 4B:
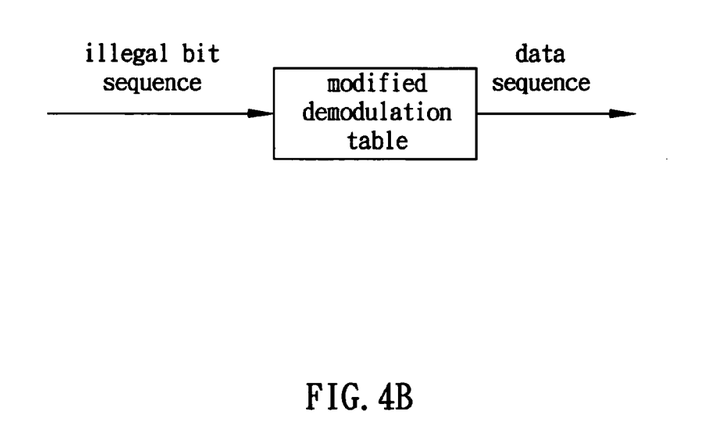
FIG. 4B depicts the demodulation architecture with modified demodulation table.

Therefore, the conventional decoding system having 1T/2T correction circuit (FIG. 3B) may further be simplified as shown in FIG. 4B. The system architecture of the present invention shown in FIG. 4A is similar to FIG. 3A, the difference is the demodulation table of FIG. 4A is modified, which increases the mappings between illegal bit sequences and data sequences as the demodulation rules.

Figure 5A:
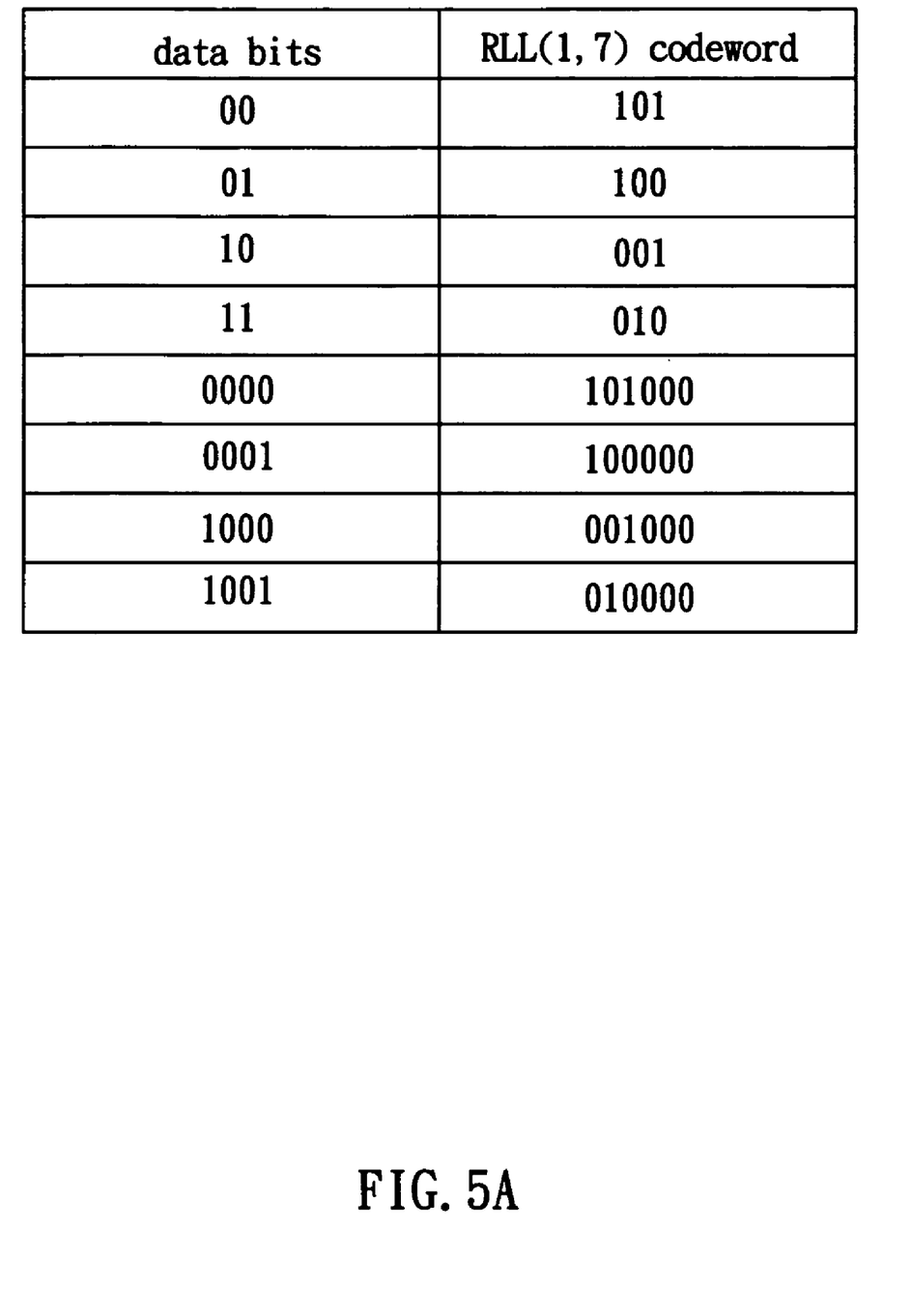
FIG. 5A depicts the encoding table of RLL (1,7) code.

The invention also provides a 1T error correctable decoding method for RLL(1,7) code and the decoding table thereof. It's understood that 1T signal component is illegal for RLL(1,7) encoded bit sequence. FIG. 5A depicts the encoding table for RLL(1,7) code. Assume that there is a data sequence 101100, the RLL(1,7) encoded bit sequence CW0 thereof is 001010101 and recorded upon a CD disk. In the next procedure, the pickup head of a CD player reads an analog signal sequence from the CD disk and further transforms it into bit sequence CW1. As foregoing descriptions, the conventional skills decodes the bit sequence CW1 directly by the decoding table no matter the bit sequence CW1 consist of 1T error or not, or perform 1T/2T correction before RLL(1,7) decoding. However, performing 1T/2T correction each time before RLL(1,7) decoding results in decoding delay and the requirement of additional correction circuit. For example, if bit sequence CW1 is 001010101 which has no 1T error involved, directly decoding by decoding table will obtain the correct data sequence. But it wastes time in determining if performing 1T/2T correction for 1T/2T correction circuit. On contrast, if the bit sequence CW1 is 001100101 which contains 1T error, the RLL decoder will obtain an incorrect data sequence 100011 by direct decoding, but the original data sequence by performing 1T/2T correction before decoding.

In order to prevent increasing the hardware circuits and the decoding delay caused by the 1T/2T correction circuit, the present invention provides a modified decoding table for correcting the illegal bit sequence. If a bit sequence CW1=001100101 which contains an 1T error, it's recognizable before the error control decoding. As mentioned above, 1T signal may cause by improper detection of the 2T signal, therefore one of the possible original bit sequences for CW1 may be 001010101. The decoding method of the present invention modifies the original demodulation table, which treats bit sequence CW1=01100101 as the improper detecting result of bit sequence CW0=001010101 and merges the relationship into the demodulation table. Therefore, if received a 1T error involved bit sequence 001100101, the decoding table will treat it as the bit sequence 001010101 and decode it into data sequence 101100 as well as decoding bit sequence 001010101. According to the modified decoding table of the invention, if the received bit sequence is 001010101, which is legal to RLL(1,7) code, the decoder decodes it into data sequence 101100 by reference to original contained mapping (001010101 to 101100); otherwise, if the received bit sequence is illegal, such as 01100101, the decoder could decode it by reference to newly demodulation rules. Hence, the modified decoding tables which contains newly added mappings between illegal bit sequence and its possible data sequence also achieves the goals of correcting illegal 1T error but without the necessity of 1T/2T correcting circuit.

Figure 5B:
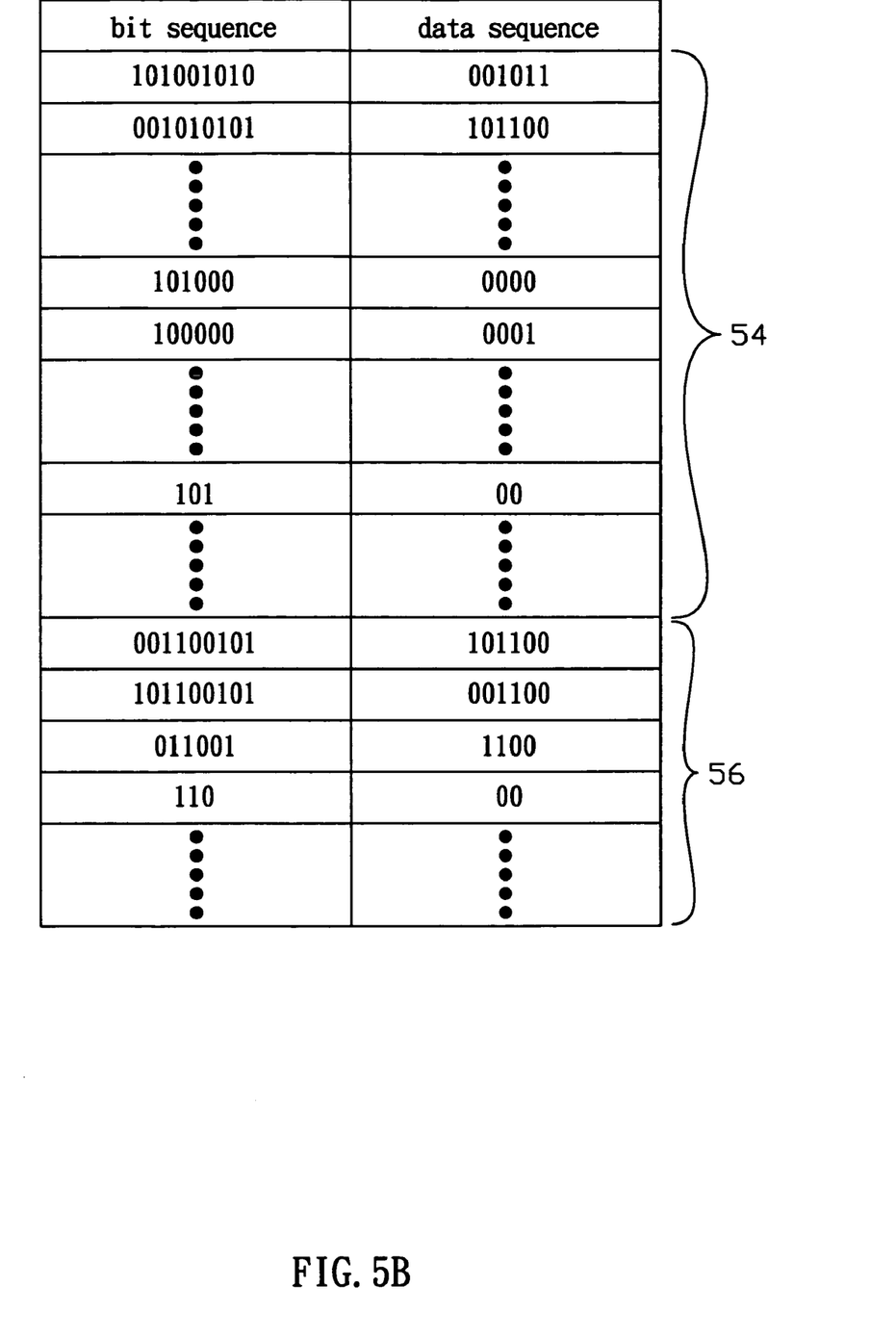
FIG. 5B depicts the diagram for the demodulation table of present invention.

Except the foregoing illegal bit sequence 001100101, the mappings between illegal bit sequences and their possible data sequences further comprise: bit sequence 101100101 associates to 001100; 011001 associates to 1100; and 110 associates to 00 . . . etc. The above-mentioned mappings are just the often-see mappings that obtained by experience and statistics, which is not intended to limit the invention to the examples. FIG. 5B depicts the diagram for the modified decoding table, which contains either the mappings between legal bit sequences and their data sequences (54), and those between illegal bit sequences and their possible data sequences (56).

The above-mentioned are only the preferred embodiments of the present invention, not intended to limit the scope thereof. It will be appreciated and carried out by those professions skilled in the art. Thus, many modifications of the embodiments that can be made without departing from the spirit of the present invention should be covered by the following claims.

I claim:

1. An error correctable decoding method comprising:
   receiving a bit sequence;
   inputting said bit sequence into a decoding circuit; and
   wherein said decoding circuit decodes said bit sequence in accordance with a demodulation table;
   wherein said bit sequence is the received signals transmitted through a communication channel or a storage media, said received signals are obtained from an encoding method which encodes a digital data sequence before transmitted, and said encoding method comprises run length limited (RLL) code;
   wherein said demodulation table records a plurality of mappings between at least a legal bit sequence and said digital data sequence, wherein said legal bit sequence is the encoding result of said digital data sequence via encoding in said encoding method, said decoding circuit decodes said legal bit sequence into said digital data sequence according to said mappings, and said legal bit sequence has a plurality of nT signal components, wherein n is an integer in an interval (a, b) excluding integers a and b;
   wherein said demodulation table further comprises a plurality of mappings between at least an illegal bit sequence and said digital data sequence, and said illegal bit sequence has a plurality of n'T signal components, wherein n' is said integer a, b, or an integer out of said interval (a, b).

2. The decoding method of claim 1, wherein said illegal bit sequence is a bit sequence which is not belonging to said legal bit sequence.

3. A 1T error correctable decoding method for RLL(1,7) code comprising:
   receiving an analog signal and transforming said analog signal into a digital bit sequence;
   inputting said digital bit sequence into a decoding circuit; and
   wherein said decoding circuit decodes said digital bit sequence in accordance with a demodulation table;
   wherein said analog signal is the received signal for a RLL(1,7) encoded digital data sequence transmitting through a communication channel;
   wherein said decoding table records a plurality of mappings between at least a legal bit sequence and said digital data sequence, wherein legal bit sequence is the encoding result of said digital data sequence via encoding in said encoding method, said decoding circuit decodes said legal bit sequence into said digital data sequence according to said mappings, and said legal bit sequence has a plurality of nT signal components, wherein n is a natural integer between 2 to 8;

wherein said decoding table further comprises a plurality of mappings between at least an illegal bit sequence and said digital data sequence.

4. The 1T error correctable decoding method of claim 3, wherein said illegal bit sequence is a bit sequence composing of 1T signal.

5. The 1T error correctable decoding method of claim 3, wherein said illegal bit sequence at least comprises 001100101, 101100101, 011001, and 110.

6. The 1T error correctable decoding method of claim 5, wherein the bit sequence 001100101 associates to a digital data sequence 101100, the bit sequence 101100101 associates to a digital data sequence 001100, the bit sequence 011001 associates to a digital data sequence 1100, and the bit sequence 110 associates to a digital data sequence 00.

7. A decoding system for RLL(1,7) code, comprising:
a receiver for receiving a signal and transforming said signal into a digital bit sequence; and
a decoding circuit, wherein said digital bit sequence is directly inputted into said decoding circuit;
wherein said decoding circuit decodes said digital bit sequence in accordance with a decoding table;
wherein said decoding table comprises the mappings between a plurality of legal bit sequence and their respective digital data sequence, said legal bit sequence has a plurality of nT signal components, wherein n is a natural integer between 2 to 8, therefore said decoding circuit decodes said digital bit sequence in accordance with said mappings, the characteristics is said decoding table further comprises the mappings between at least an illegal bit sequence and said digital data sequence, thereby said decoding circuit decoding said digital bit sequence according to said mappings between said illegal bit sequence and said digital data sequence when said digital bit sequence belongs to said illegal bit sequence.

8. The decoding system of claim 7, wherein said illegal bit sequence is a bit sequence composing of 1T signal.

9. The decoding table system of claim 7, wherein said illegal bit sequence at least comprises 001100101, 101100101, 011001, and 110.

10. The decoding system of claim 9, wherein the bit sequence 001100101 associates to a digital data sequence 101100, the bit sequence 101100101 associates to a digital data sequence 001100, the bit sequence 011001 associates to a digital data sequence 1100, and the bit sequence 110 associates to a digital data sequence 00.

* * * * *